Dec. 5, 1961 R. R. NEWSOM 3,012,101

ELECTRONIC SWITCHES AND CIRCUITS

Original Filed May 20, 1949 3 Sheets-Sheet 1

INVENTOR.
Roy R. Newsom
BY
H. A. McGrew
ATTORNEY

Dec. 5, 1961 R. R. NEWSOM 3,012,101

ELECTRONIC SWITCHES AND CIRCUITS

Original Filed May 20, 1949 3 Sheets-Sheet 2

INVENTOR.
Roy R. Newsom
BY
H. A. McGrew
ATTORNEY

Dec. 5, 1961 R. R. NEWSOM 3,012,101

ELECTRONIC SWITCHES AND CIRCUITS

Original Filed May 20, 1949 3 Sheets-Sheet 3

INVENTOR.
Roy R. Newsom
BY
A. A. McGrew
ATTORNEY

United States Patent Office 3,012,101
Patented Dec. 5, 1961

3,012,101

ELECTRONIC SWITCHES AND CIRCUITS

Roy R. Newsom, Greeley, Colo.
(7160 W. Ellsworth Place, Denver 26, Colo.)

Continuation of abandoned application Ser. No. 94,432, May 20, 1949. This application Jan. 28, 1952, Ser. No. 268,581
3 Claims. (Cl. 179—15)

The present invention relates to electronic switches and circuits associated therewith, and more particularly to electronic switches of a novel type and various circuits and instruments usable therewith.

This application is a continuation of my copending application Serial No. 94,432, filed May 20, 1949, now abandoned.

An object of this invention is to provide a new electronic instrument which performs a switching action without impulse distortion of any kind and specifically without the electrical disturbances usually associated with mechanical relay or revolving switch actions.

Another object of this invention is to provide a new electronic switching device useful in various types of circuits for inducing separate signals derived from separate sources onto a single carrier system.

A further object of this invention is to provide an electronic switching device which permits the simultaneous observation on the screen of a cathode ray tube of a number of electrical signals derived from separate sources.

A further object of this invention is to provide an electronic switching device which permits the simultaneous or separate observation on the screen of a cathode ray tube of selected separate electrical signals derived from separate sources.

Another object of the present invention is to provide an electronic switching device in which the impulses imposed on the separate carrier systems are time-spaced in accordance with the requirements of the installation by means of controls for independently changing the frequency and duration of the separate impulses.

Another object of this invention is to provide an electronic switching device which provides separate carrier impulses in separate circuits thereof, said carrier impulses being time-spaced with relation to each other.

A still further object of this invention is to provide an electronic switching device of the foregoing character in which provision is made for the imposition of separate signals on said carrier impulses.

Another object of this invention is to provide an electronic circuit in which the amplitude of the signals imposed on the carrier impulses may be varied independently of the amplitude of any other signals by means of controls on the signal input circuit of this device.

A further object of this invention is to provide an electronic switching device in which all of the carrier impulses are amplified by the same amplifier channel.

Other and important objects and advantages of the present invention will be apparent from the following description and drawings in which.

This invention provides a crystal oscillator having frequency drift control in the grid circuit adapted to provide an oscillating current of desired frequency. The output of the crystal oscillator is fed into the primary of a transformer having a center tapped secondary and the opposite ends of the secondary lead to the grids of two separate voltage amplifier tubes. By reason of this transformer connection the voltage derived from the separate amplifiers will be time-spaced the equivalent of 180 electrical degrees. The output of the separate amplifiers is passed through parallel phase shifting circuits to divide the output and speed or delay the wave impulses thus providing further time separation of the voltage impulses passed into the next stage of the circuit.

The next stage comprises a series of vacuum tube limiter circuits adapted to square the wave form introduced. From these tubes the output is delivered across a short timing constant to peak the square wave form and then into a second limiter circuit adapted to clip the wave form to a positive or negative impulse as desired. As a result of the aforementioned circuits a plurality of carrier impulses are derived which are so timed and spaced that there will be no interference between the separate carrier impulses when the system is properly tuned. These carrier impulses may be all fed to the same carrier line and the separate divided impulses will not interfere with each other because of the time spacing.

Figure 1:
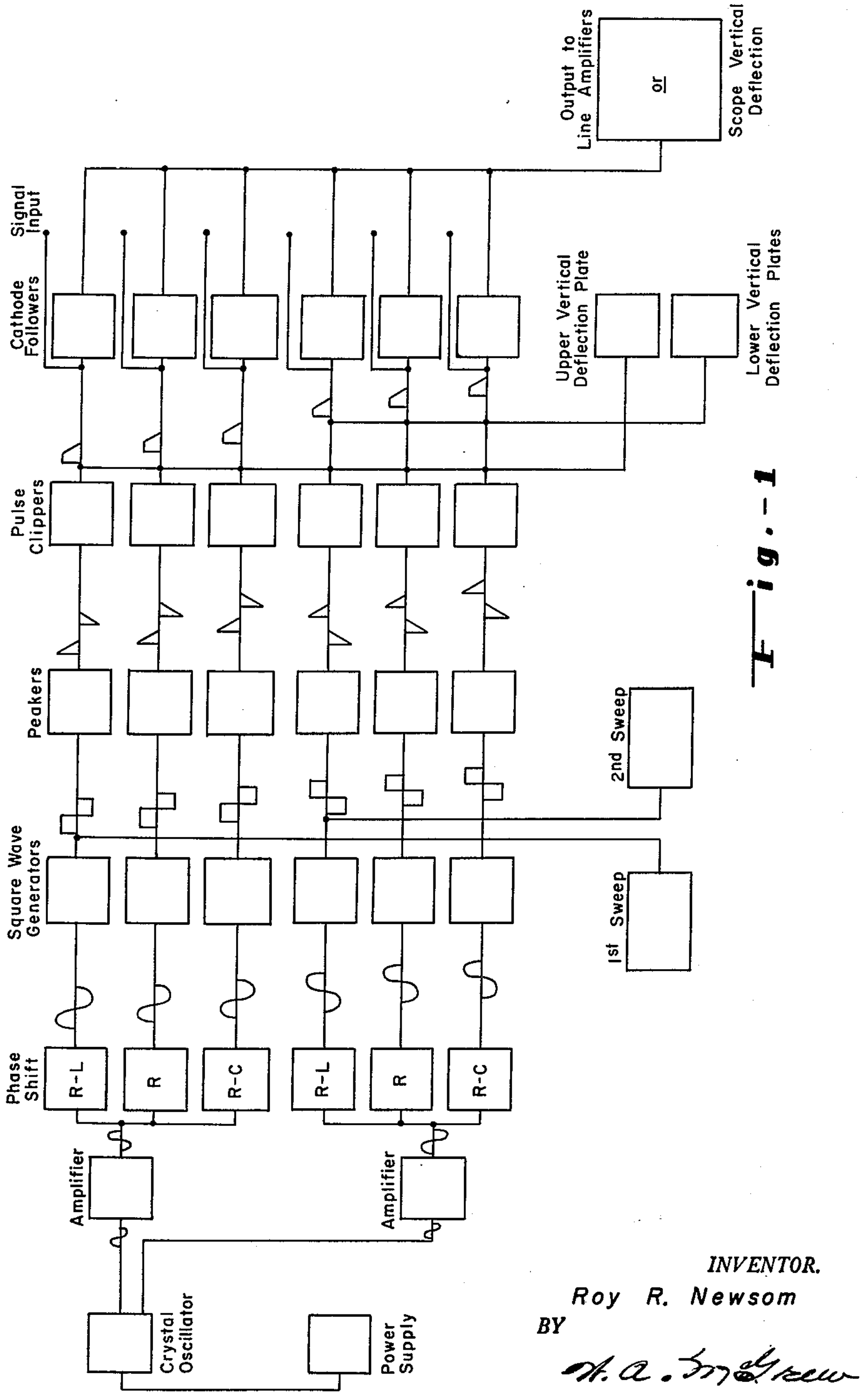
FIG. 1 is a block diagram of the circuits of this invention in which the input and output electrical wave shapes of each stage in the circuit are shown.
Figure 2:
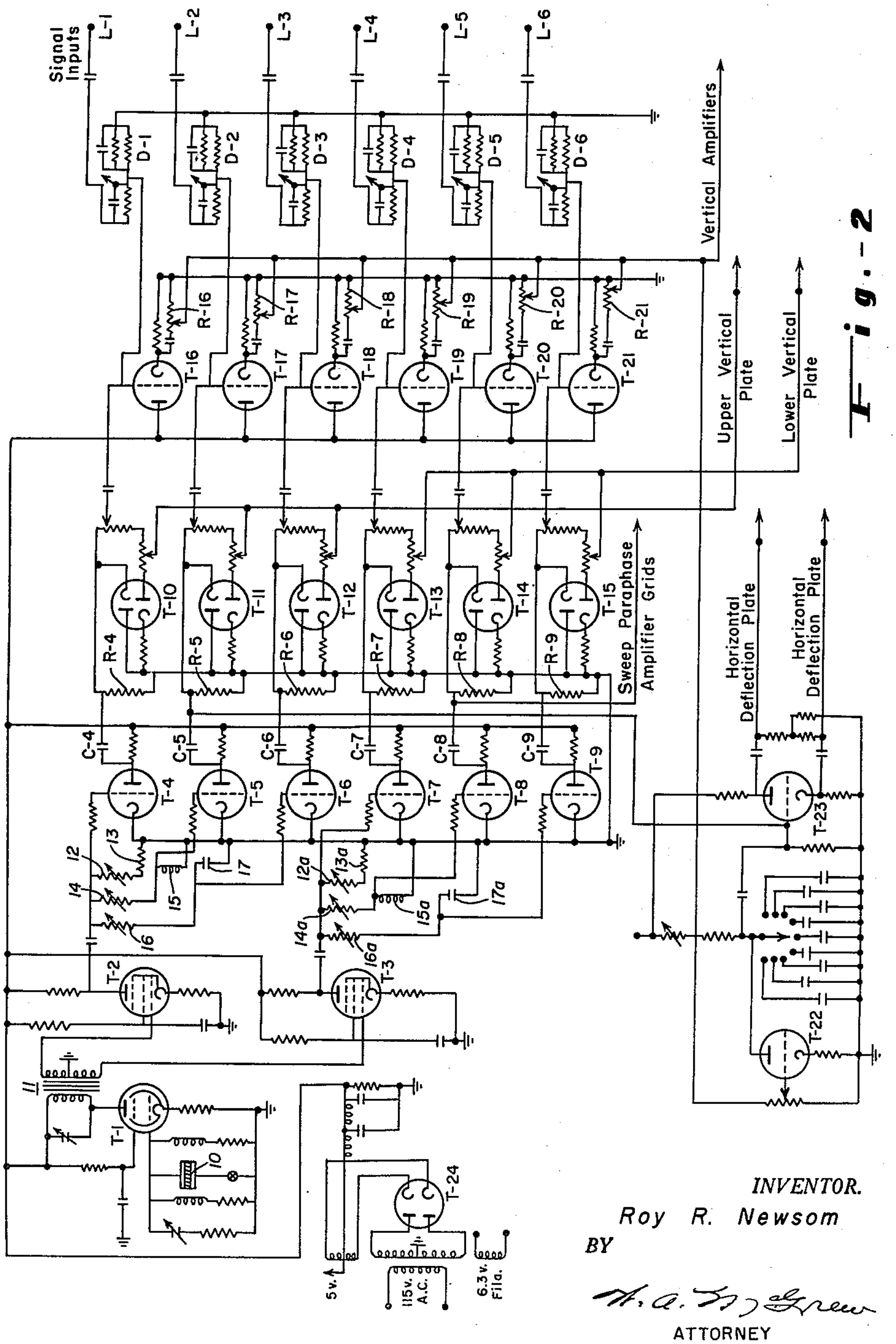
FIG. 2 represents a wiring diagram showing the component elements of this invention as used in conjunction with a cathode ray oscilloscope.

As a further development of this invention a circuit is provided by means of which separate signals may be imposed on the carrier impulses previously mentioned. Preferably the input signals are passed through a compensated voltage divider to the grid of a cathode follower circuit. By means of this arrangement the separate input signals will be imposed on the carrier impulses only when the cathode follower tubes are conducting. Because of this arrangement it will be seen that it is possible to impose a considerable number of input signals on a single output carrier line without distortion or interference. This advantage of this invention may be used in various situations to increase the capacity of carrier circuits and lines. Its application to telephone circuits and the like can be readily seen inasmuch as it would make it possible to increase the capacity of the telephone carrier circuits in direct proportion to the number of time separated carrier impulses generated by this electronic switching device. Application of this invention to a special circuit analyzing device is shown in FIGS. 1 and 2 in which the output carrier impulses are fed to the vertical amplifiers of a conventional type oscilloscope. When so used this invention provides a means for observing the wave forms of a plurality of separate circuits simultaneously or separately as desired.

Referring now to the drawings the details and operation of this invention will be more clearly set forth.

Figure 3:
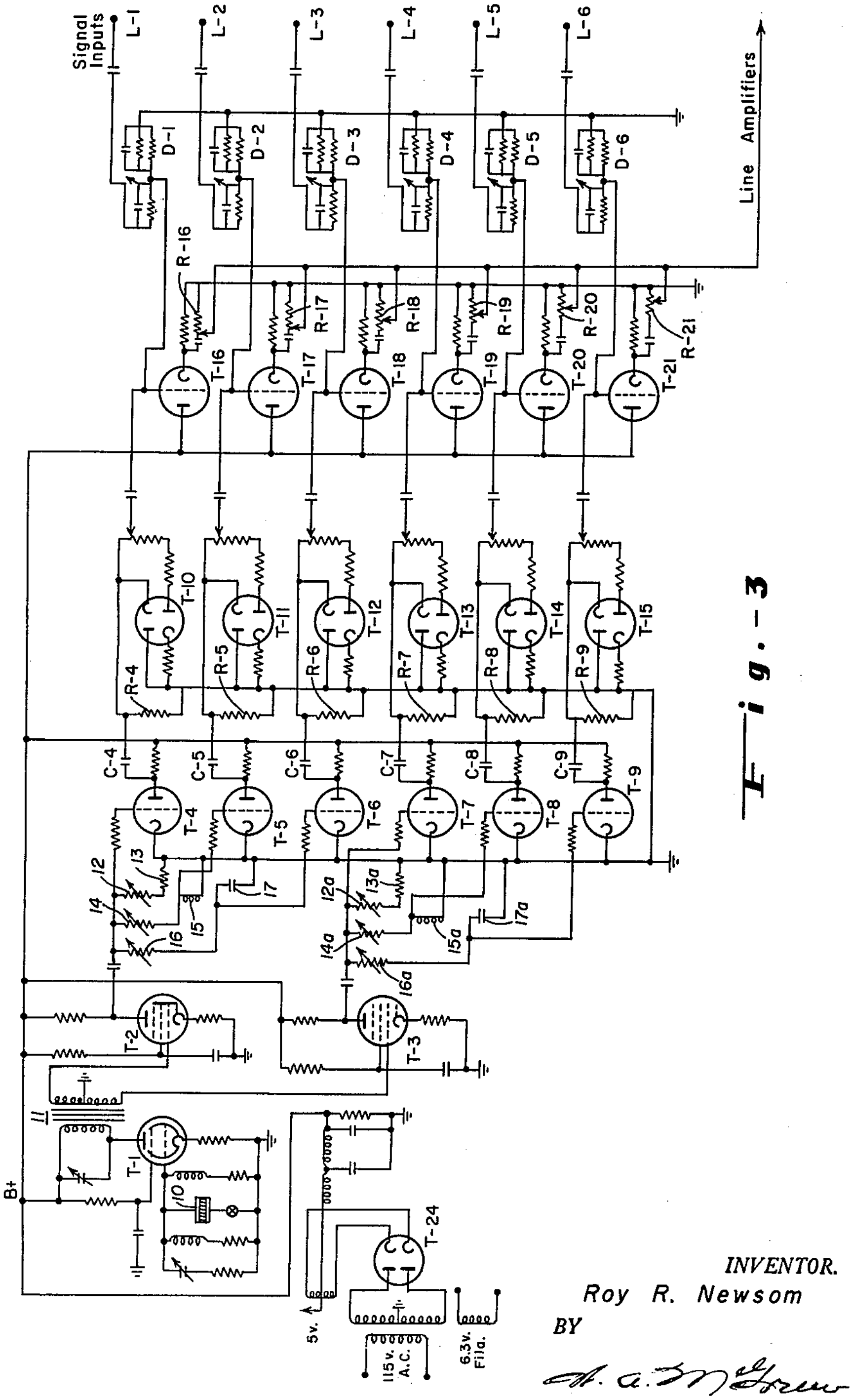
FIG. 3 represents a wiring diagram showing the component elements of this invention as connected in a conventional type circuit for this invention.

The basic circuit of this invention is shown in schematic form in FIG. 3. In this figure an oscillator tube T–1 is provided having frequency drift control including a crystal 10 in the grid circuit. Through use of this crystal oscillator circuit a sine wave alternating current of regulated frequency is induced on the primary of a transformer 11 having a center tapped secondary. The opposite terminal ends of the transformer secondary lead respectively to the grids of amplifier tubes T–2 and T–3. Since the potential thus imposed on the grids of the amplifier tubes T–2 and T–3 is derived from opposite ends of the transformer secondary, it is apparent that the grid potential of tubes T–2 and T–3 will be 180° out of phase. Accordingly the outputs of the amplifiers T–2 and T–3 are 180° out of phase though of increased amplitude.

The plate outputs of the amplifiers T–2 and T–3 are next connected to similar parallel circuits in each of which the voltage is divided to pass respectively across a resistor circuit, a resistor inductance or L/R circuit and a resistance capacitance or R-C circuit. The resistor circuits for the tubes T–2 and T–3 comprise adjustable resistances 12 and 12*a*, respectively, connected in series with fixed resistors 13 and 13*a*, respectively. The L-R circuits for the tubes T–2 and T–3 comprise adjustable resistances 14 and 14*a*, respectively, and inductances 15 and 15*a*, respectively. Similarly the R-C circuits comprise adjustable resistances 16 and 16*a*, respectively, and capacitors 17 and 17*a*, respectively. The time constants of these respective circuits are such that while the voltage across the pure resistance is practically in phase with the amplifier plate voltage, the voltage across the capacitance lags the amplifier output by 60° and the voltage across the inductance leads the amplifier output by 60°. Considering the circuits connected to the amplifiers T–2 and T–3, this arrangement provides an output of six sine wave voltages at oscillator frequency spaced at 60° and of approximately ⅔ the amplitude of the amplifier output. In other words the voltage of each separate circuit is time spaced apart ⅙ of the oscillator frequency. The even spacing of these voltages is important in this invention and it will be noted that means are provided for tuning the separate circuits to obtain the correct interval between the separate circuits.

The time-spaced sine wave voltages in the six separate circuits are next passed to six square wave limiting circuits as represented by the triode limiters T–4 to T–9. These triode limiters use grid limiting and cutoff action to square the sine waves. If desired diode or duo-diode limiters may be used by readapting the circuit. The evenly time spaced square wave outputs from the separate limiter circuits are next taken across short R-C time constant circuits to produce a peaked pulse output. These circuits comprise capacitors C–4 to C–9 connected respectively in series with resistors R–4 to R–9. If desirable a coil or vacuum tube could be used in place of the R-C time constant. These peaked pulses are then fed to duo-diode clipper tubes indicated at T–10 to T–15 inclusive which clip the positive going peaks to a positive reference potential. Likewise the negative pulses are limited by the diode limiting action.

By reason of the foregoing the outputs from the duo-diode tubes T–10 to T–15 are six evenly spaced positive pulses of short time duration and limited to a predetermined positive reference potential. It should be noted that by reason of the peaking circuit and the subsequent pulse clipping, the time duration of the six separate pulses is so limited that there will be time separation between each of the separate pulses. Since the pulses are time separated, the six circuits from the duo-diode clipper tubes could all be connected to a single line without interference between the separate pulses even though the pulse rate is six times the rate of the original oscillator frequency.

This time spacing of the separate pulses can be used in many ways in conventional electronic circuits. Generally it will be desirable to induce separate signals on these separate pulses before they are fed to a single carrier line. A means for inducing such separate signals on the six time spaced pulses is likewise shown in the FIGS. 1, 2 and 3. In these figures it will be seen that six separate lines L–1 to L–6 are provided upon which separate input signals may be imposed. These signals are fed across compensated voltage dividers D–1 to D–6 to the grid of cathode follower tubes T–16 to T–21 which are biased below cutoff and normally not conducting. The time spaced pulses from the duo-diode clipper tubes T–10 to T–15 are likewise fed to the grid of the cathode follower tubes T–16 to T–21. The positive pulse will in effect raise the bias of the cathode followers T–16 to T–21 so that the tubes will conduct when and only when the positive pulses are imposed on the grids.

By means of this arrangement the input signal impulses upon each cathode follower grid will be passed to the output cathode resistor only when the time spaced positive pulses arrive at each tube. The output from the cathode resistors indicated as six adjustable resistors R–16 to R–21, inclusive, is then fed to a single carrier line which by reason of this circuit will carry without distortion six times spaced pulses having separate signals imposed on each pulse. As shown in FIG. 3 this separate carrier line can then be led to line amplifiers or other conventional circuits for any use desired. Application of this circuit to the communication industries will be readily apparent. For instance, the capacity of conventional telephone lines could be increased considerably by use of the circuits of this invention. Since the carrier pulses are time spaced sufficiently to obviate any interference, the number of messages or signals carried by each separate pulse could be increased to the same extent now possible through the use of multiple frequencies.

Application of the basic circuits shown in FIG. 3 to the special purpose of providing a cathode ray oscilloscope capable of presenting a plurality of wave forms on a single screen is shown in FIGS. 1 and 2. The actual circuit employed is shown in FIG. 2. Here it will be noted that the output from the cathode followers is connected to the vertical amplifiers while the output from the duo-diode clipper tubes T–10, T–11 and T–12 is fed to the upper vertical plate and the output from the duo-diode clipper tubes T–13, T–14 and T–15 is fed to the lower vertical plate of the oscilloscope. The square wave output from the tube T–4 is applied to the paraphase amplifier grids of one sweep generator, thereby providing a single time base circuit for the signals from tubes T–16, T–17 and T–18. Also the square wave from the tube T–7 may be applied to the paraphase amplifier grids of the second sweep circuit to provide a separate time base for the signals from tubes T–19, T–20 and T–21. Since the two square waves from T–4 and T–7 are 180° out of phase they will provide alternate synchronized operation of the two sweep circuits. If desired additional time base circuits may be added and synchronized with the positive pulses, but since in comparison of electrical impulses each signal usually bears some harmonic relation to some of the others two time bases are sufficient for general observation.

In operation of the circuit as shown in FIGS. 1 and 2, raising the potential on the vertical deflection plates will raise the electron beam of the oscilloscope to provide a separate trace for each signal as it appears on the oscilloscope screen. The pulses from the tubes T–10, T–11, and T–12 when placed on the upper deflection plate raise the axis while the signals from T–16, T–17 and T–18 are on the screen and the pulses from T–13, T–14, and T–15 when placed on the lower deflection plate lower the axis while tubes T–19, T–20 and T–21 are conducting. Manipulation of the controls thus permits the operator to use separate axes for the separate signals, to super-impose one or more signals over one or more other signals, or to observe the separate signals single or together as desired.

From the foregoing it will be apparent that the principles of this invention are adaptable to many known types of electric circuits to provide obvious improvements in operation and utility of various electric and electronic devices. Accordingly while separate embodiments of this invention have been shown and described, this invention is not limited to the specific uses described. For these reasons any modifications or changes of this circuit which are within the scope of the hereunto appended claims are deemed to be a part of this invention.

I claim:

1. In combination in an electronic system of the multiplexing type transmitting bursts of intelligence spaced from one another by a predetermined time interval, an oscillator for generating an alternating waveform of regulated frequency, a plurality of separate circuits comprising phase shifting circuits having connection with the output of said oscillator for effecting predetermined differing phase shifts of the separate waveforms of said separate circuits, a plurality of pulse forming circuits, one connected to the output of each of said phase shifting circuits for forming pulses related to the phase shifted waveforms, a plurality of intelligence gating circuits connected one with each pulse forming circuit at one output thereof, a plurality of intelligence feeder circuits connected one with each gating circuit whereby separate signals each modulated on a different frequency sub-carrier may be supplied to said gating circuits, each gating circuit including an electron tube connected as a cathode follower having an output connected to a common terminal, the gating circuits being adapted to permit said bursts of intelligence from each of said intelligence feeder circuits to pass to the common terminal during the existence of the corresponding gating pulse whereby time spaced pulses appear at the output of the pulse forming circuits and are transmitted by said common terminal as repeating groups of time-spaced pulses each group containing a sampling of each of said feeder circuits.

2. An electronic switching circuit for use with oscilloscopes to provide means for viewing a plurality of waveforms on the single oscilloscope screen comprising an oscillator for generating an alternating current sine wave voltage, a plurality of phase shifting circuits connected in parallel to the output of said oscillator for time-spacing the separate voltage waveforms in the separate circuits, vacuum tube limiter circuits in said separate circuits for squaring the waveform, peaking circuits for sharpening the waveform, pulse clipping means connected to said peaking circuits for biasing the positive going peaks and limiting the negative going peaks, cathode followers connected to the output of said pulse clipping circuits, separate signal carrying lines connected to said cathode followers for inducing separate signals on the resultant time-spaced positive pulses, lines connecting the output of said cathode followers to the vertical amplifiers of said oscilloscope, means for adjusting the amplitude of the output signals of each of said cathode followers, means connecting the output of one group of pulse clipping circuits to the upper vertical plate of said oscilloscope, means connecting the output of a separate group of pulse clipping circuits to the lower vertical plate of said oscilloscopes, and means arranged to adjust the amplitude of each of said pulses of said groups impressed on said vertical plates for selectively positioning the corresponding signals on said oscilloscope.

3. An electronic switching circuit for use with oscilloscopes to provide means for viewing a plurality of waveforms on the single oscilloscope screen comprising an oscillator for generating an alternating current sine wave voltage, a plurality of phase shifting circuits connected in parallel to the output of said oscillator for time spacing the separate voltage waveforms in the separate circuits, vacuum tube limiter circuits in said separate circuits for squaring the waveform, peaking circuits for sharpening the waveform, pulse clipping means connected to said peaking circuits for biasing the positive going peaks and limiting the negative going peaks, cathode followers connected to the output of said pulse clipping circuits, separate signal carrying lines connected to said cathode followers for inducing separate signals on the resultant time spaced positive pulses, lines connecting the output of said cathode followers to the vertical amplifiers of said oscilloscope, means for adjusting the amplitude of the output signals of each of said cathode followers, means connecting the output of one group of pulse clipping circuits to the upper vertical plate of said oscilloscope, means connecting the output of a separate group of pulse clipping circuits to the lower vertical plate of said oscilloscope, means arranged to adjust the amplitude of each of said pulses of said groups impressed on said vertical plates for selectively positioning the corresponding signals on said oscilloscope, and separate time base circuits connected to the paraphase amplifier grids of the separate sweep generators of said oscilloscope.

References Cited in the file of this patent

UNITED STATES PATENTS

| | | |
|---|---|---|
| 1,194,820 | Colpitts | Aug. 15, 1916 |
| 2,009,438 | Dudley | July 30, 1935 |
| 2,092,442 | Colwell | Sept. 7, 1937 |
| 2,213,320 | Mathes et al. | Sept. 3, 1940 |
| 2,380,982 | Mitchell | Aug. 7, 1945 |
| 2,405,239 | Seeley | Aug. 6, 1946 |
| 2,413,440 | Farrington | Dec. 31, 1946 |
| 2,419,546 | Grieg | Apr. 29, 1947 |
| 2,444,950 | Nichols et al. | July 13, 1948 |
| 2,455,283 | Valley | Nov. 30, 1948 |
| 2,459,131 | Mesner | Jan. 11, 1949 |
| 2,479,920 | Hansell | Aug. 16, 1949 |
| 2,548,796 | Houghton | Apr. 10, 1951 |
| 2,551,681 | Lawrence | May 8, 1951 |
| 2,559,644 | Landon | July 10, 1951 |
| 2,605,360 | Trevor | July 29, 1952 |